United States Patent [19]

Smith et al.

[11] Patent Number: 5,196,144
[45] Date of Patent: Mar. 23, 1993

[54] ELECTRICALLY CONDUCTIVE POLYANILINE

[75] Inventors: Paul Smith; Alan J. Heeger, both of Santa Barbara; Yong Cao, Goleta; Jin-Chih Chiang, Goleta; Alejandro Andreatta, Goleta, all of Calif.

[73] Assignee: Regents of the University of California, Oakland, Calif.

[21] Appl. No.: 264,602

[22] Filed: Oct. 31, 1988

[51] Int. Cl.$^5$ ............................................... H01B 1/06
[52] U.S. Cl. ................................... 252/500; 252/518; 528/422; 525/540
[58] Field of Search ................ 252/500, 518; 528/422; 525/540

[56] References Cited

U.S. PATENT DOCUMENTS

| | | |
|---|---|---|
| 4,025,342 | 5/1977 | Trevoy. |
| 4,586,792 | 5/1986 | Yang et al. ........................... 350/357 |
| 4,731,408 | 3/1988 | Jasne ................................... 252/511 |

OTHER PUBLICATIONS

Machinnes, Jr., David and Funt, Lionel B., "Poly-o-Methoxyaniline: A New Soluble Conducting Polymer" Synthetic Metals pp. 1-8, (1988).
Fosong et al "Study on the Crystallinity of Polyaniline", Mol. Cryst. Liq. Cryst., 1988 vol. 160 pp. 175-184.
Willstatter et al., (1909) Ber 42:2147.
Willstatter et al., (1909) Ber 42:4118.
Green et al., (1910) J. Chem. Soc. 97:2388.
Green et al., (1912) J. Chem. Soc. 101:1117.
Angelopoulos et al., (1987) Synth. Met. 21:21.
Wang et al., (1986) Synth. Met. 16:99.
Annis et al., (1986) Synth. Met. 22:191.
Andreatta et al., (to be published).
Watanabe et al., (1987) Chem. Commun., No. 1, pp. 3-4.
Li et al., (1987) Synth. Met. 20:141.
Li et al., (1988) Synth. Met. 16:99.
Ray et al., (1988) Synth. Met. (in press).

Primary Examiner—Karl Group
Assistant Examiner—Anthony J. Green
Attorney, Agent, or Firm—Morrison & Foerster

[57] ABSTRACT

Polyanilines are provided that are soluble and that form crystaline solids upon precipitation. The solid polyanilines are electrically conductive, soluble, and can be fabricated into various shaped articles for use in, for example, batteries, electrodes, photovoltaic cells, semiconductor devices and the like.

15 Claims, 3 Drawing Sheets

ELECTRICALLY CONDUCTIVE POLYANILINE

ACKNOWLEDGMENT OF GOVERNMENT SUPPORT

This invention was made with U.S. Government support under Grant No. DMR-87-03399 awarded by the National Science Foundation. The U.S. Government has certain rights in this invention.

FIELD OF THE INVENTION

This invention relates generally to conducting polymers, and more particularly relates to electrically conductive, shaped articles such as fibers, tapes, rods and films of polyaniline as processed and fabricated from solutions in certain strong acids.

BACKGROUND OF THE INVENTION

Polyaniline has emerged as one of the more promising conducting polymers, because of its excellent chemical stability combined with respectable levels of electrical conductivity of the doped or protonated material. Processing of polyaniline into useful objects and devices, however, has been problematic. Melt processing is not possible, since the polymer decomposes at temperatures below a softening or melting point. In addition, major difficulties have been encountered in attempts to dissolve the material.

Conflicting reports exist on the solubility of polyaniline, with contradictory views advanced as early as 1910. Willstatter and Dorogi reported that an oligomeric (eight-monomer chain compound) aniline was largely insoluble. Willstatter et al. (1909) Ber 42:2147; id. at 4118. Green and Woodhead repeated their experiments and claimed solubility of this nonpolymeric material in 80% acetic acid, 60% formic acid, pyridine and concentrated sulfuric acid. Green et al. (1910) J. Chem. Soc. 97:2388; Green et al. (1912) J. Chem. Soc. 101:1117. In recent years, Angelopoulos and coworkers and Wang et al. reported only partial solubility of polyaniline, in its emeraldine base form, in N-methylpyrrolidone (NMP), dimethylformamide (DMF), tetrahydrofuran (THF), benzene and chloroform. Angelopoulos et al. (1987) Synth. Met. 21:21; Wang et al. (1986) Synth. Met. 16:99. As a result, it has become common, laborious practice to "remove insoluble material", and use the soluble, probably oligomeric, polyaniline fraction for the preparation of films. Angelopoulos et al. (1987) Synth. Met. 21:21. Such cast films are predominantly amorphous, much like the as-synthesized material. Annis et al. (1986) Synth. Met. 22:191; Andreatta et al. (to be published). More recently, Watanabe and coworkers claimed total insolubility of the emeraldine salt of polyaniline in any solvent. Watanabe et al. (1987) Chem. Commun. 3.

Trevoy, U.S. Pat. No. 4,025,342, reports that emeraldine sulfate is an insoluble microcrystalline powder, thus lacking utility in practical conducting coatings. Trevoy proposes to solve this problem by combining short oligomers of aniline salts with other, more easily processed polymers. Jasne, U.S. Pat. No. 4,731,408, also recognized the need for improved processability of conducting polymers such as polyaniline, noting particularly insolubility as a problem. Jasne proposes preparing polyaniline by polymerizing the monomer in a latex dispersion which serves as a counter ion, the latex comprising 50–97% by weight of the resulting film. Yang et al., U.S. Pat. No. 4,586,792, also recognizes the insolubility of polyaniline.

Routes towards soluble polyaniline include the preparation of graft and co-polymers, and polyaniline derivatives. Li et al. (1987) Synth. Met. 20:141; Li et al. (1988) Synth. Met. (in press); Wang et al. (1986) Synth. Met. 16:99; Ray et al. (19880 Synth. Met. (in press). Unfortunately, these species invariably show significantly reduced conductivities in comparison with the (unmodified) homopolymer.

Until now, this polyaniline generally has been categorized as intractable and amorphous. Polyaniline articles, therefore, are typically fabricated through elaborate compaction techniques, yielding relatively poor mechanical coherence, frequently with poly(tetrafluoroethylene) binder material. Thus, the ability to fabricate high quality, crystalline polyaniline into shaped articles such as fibers, films and the like remains seriously limited, despite nearly eighty years of research.

SUMMARY OF THE INVENTION

It is accordingly an object of the present invention to overcome the aforementioned disadvantages of the prior art and to provide shaped articles, oriented fibers, tapes and the like of a crystalline polyaniline by processing from solution.

It is another object of the invention to provide shaped articles, oriented fibers, tapes and the like from composites or polyblends of a crystalline polyaniline and other polymers (for example polyamides, aromatic polyamides (aramids), etc., etc.) that co-dissolve with polyaniline in acids.

A further object of the invention is to apply the above objects to polyanilines generally, as well as polyaniline per se in its emeraldine salt, emeraldine base, or leucoemeraldine base forms.

These and other objects can be achieved by one or more of the following embodiments of the invention.

In one embodiment, the present invention is directed to a solid composition comprising a crystalline polyaniline. In a preferred embodiment, the solid polyaniline is completely soluble.

In another embodiment, the invention is directed to a liquid composition comprising in solution (i) a polyaniline having a minimum molecular weight of about 5000, and (ii) an acid capable of dissolving said polyaniline.

In a further embodiment, the invention is directed to a method of fabricating a shaped article comprising: (a) providing a liquid polymer composition containing a polyaniline dissolved in an acid; and (b) subjecting said liquid polymer composition to a shaping step selected from the group consisting of spinning, casting or extrusion, whereby said polyaniline is precipitated to a solid in a crystalline form.

Additional embodiments, objects, advantages and novel features of the invention are set forth in part in the description which follows, or become apparent to those of ordinary skill in the art.

DETAILED DESCRIPTION OF THE INVENTION

Figure 1:
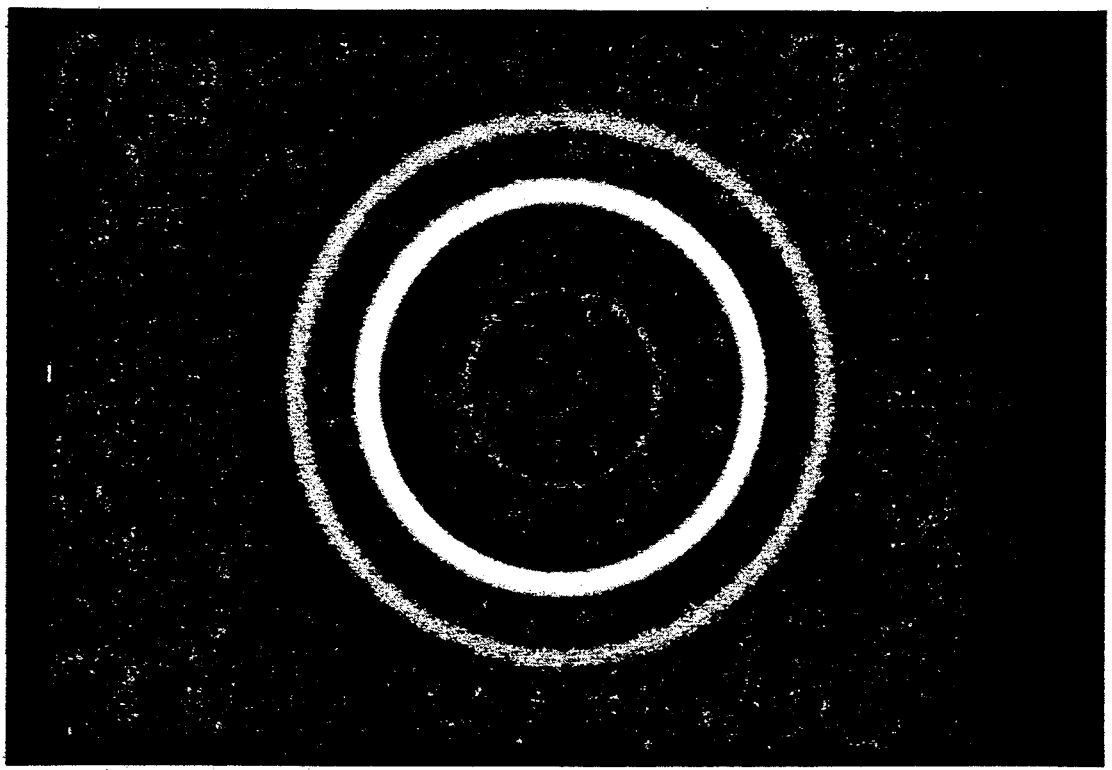
FIG. 1 shows the wide-angle X-ray diffraction pattern of a polyaniline film, precipitated in $H_2O$ from a 15% w/w solution $H_2SO_4$.

In the general practice of the present invention, shaped articles such as fibers, tapes, rods and films, comprising a crystalline, are fabricated from a solution of the polymer in an acid. Initially, polyaniline is synthesized by any appropriate procedure. The polymer material is then completely dissolved in acid. Subsequently, the polymer is processed from these acid solutions into the desired shaped forms made of high quality, partially crystalline polyaniline in the emeraldine salt form. If desired, the material making up the shaped articles can be subsequently deprotonated to high quality partially crystalline polyaniline in either the emeraldine base form, or the fully reduced leucoemeraldine form.

Surprisingly, it has been discovered that, (i) high molecular weight polyanilines are completely soluble in acids, particularly strong acids, (ii) mechanically coherent articles can be processed from these solutions of polyaniline, (iii) the resulting material is partially crystalline, (iv) the resulting material can be oriented by processing from solution, and (v) the resulting coherent objects are electrically conductive in the as-processed form without need for further treatment.

While the present invention will be described in more detail below with respect to polyaniline per se, it is to be understood that the principles of the present invention are applicable to substituted polyanilines as well as polyaniline derivatives. Thus, as used herein, a the polyaniline class (i.e., including substituted or derivative forms) will be referred to collectively as "polyanilines", and members of the class will be referred to individually as "a polyaniline". Examples of polyanalines are those made from monomers having the following structure:

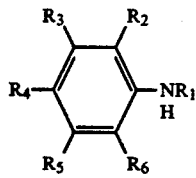

wherein $R_1$ can be H or alkyl, preferably H or $C_1$-$C_5$ alkyls; and $R_2$ to $R_6$ can be any suitable substituent, including alkyl, aralkyl, alkaryl, hydroxy, alkyloxy, halogen, or nitro substituents. Preferred substituents include hydrogen, $C_1$-$C_{10}$ alkyls, methoxy, ethoxy, Cl, F, Br, I, CN, $SO_3H$, COOH, $COCH_3$, $NO_2$, phenyl, tolyl, and benzyl. Particularly preferred $R_2$-$R_6$ substituents are hydrogen and $C_1$-$C_5$ alkyls.

The invention is also directed to polyanilines in any of their oxidation states. Thus, with respect to polyaniline, the present invention includes the fully reduced leucoemeraldine base, the "half" oxidized emeraldine base, the fully oxidized pernigraniline base, and the emeraldine salt (e.g., emeraldine hydrochloride). The synthesis of polyanilines is well known in the art. See, e.g., Chiang et al. (1986) Synth. Met. 13:193-205; MacDiarmid et al. (1987) Synth. Met. 18:285-290; MacDiarmid et al. (1985) Mol. Cryst. Liq. Cryst. 121:173; U.S. Pat. No. 4,520,086; U.S. Pat. No. 4,586,792; U.S. Pat. No. 4,731,408. The selection of the appropriate synthetic method is within the skill of the art. The resulting product is amorphous, and not crystalline.

Polyaniline prepared by standard methods is then formulated into a solution according to the present invention. The "as synthesized" polyaniline will usually completely dissolve in an acid, particularly strong acids. Solutions prepared according to the invention will generally have at least about 5% (w/w) of polyaniline dissolved in acid. More concentrated solutions, however, can readily be prepared at room temperature, e.g., at least about 10% to about 20% (w/w), preferably about 15% to about 20% (w/w). Even more concentrated solutions can be prepared at elevated temperatures. These solutions are characterized as containing high molecular weight polyaniline, as opposed to only the oligomeric forms dissolved in prior art compositions. For example, the molecular weight of the dissolved polyaniline is usually a minimum of about 5000, and preferably about 10,000. More preferred compositions include those where the molecular weight is in the range from about 30,000 to about 100,000. The molecular weight of the polyaniline in the solutions of the present invention can be determined by standard techniques, such as gel permeation chromatography.

The high molecular weight polyaniline solutions of the present invention can also be characterized by viscosity. For example, the room temperature inherent viscosity of the dissolved polyanilines of the present invention, in concentrated sulfuric acid is usually a minimum of about 0.3 dl/g (0.1% w/w polymer). In preferred embodiments, the viscosity is a minimum of about 0.6 dl/g and more preferably a minimum of about 1 dl/g.

Various acids have been found to be suitable solvents for polyaniline. Typically, complete dissolution requires strong acids. Examples of suitable acids include $H_2SO_4$ (concentrated and fuming), $CH_3SO_3H$, $ClSO_3H$, $CF_3SO_3H$ and $HNO_3$ (70% or fuming). Generally it is preferred to select acids such as concentrated $H_2SO_4$ or $CH_3SO_3H$ that completely dissolve the polymer without any degradation. It is within the skill of the art based on the present disclosure to screen various acids, particularly strong acids, for their ability to dissolve polyaniline. Degradation of the polymer can be judged from infrared spectra and viscosity.

Solid compositions of the invention comprising polyaniline are prepared by precipitation of polyaniline from the above-described acid solutions. The addition of a liquid in which polyaniline is not soluble to the acid solutions of the present invention will cause the polyaniline to precipitate. Various liquids can be used, such as water or organic solvents miscible in water, such as methanol, ethanol, acetone, aqueous salt solutions, or even acids in which polyaniline is not soluble. The rate of addition of the non-solvent, temperature, agitation, and the like will have an effect on the degree of crystallinity of the resulting solid. However, a crystalline structure is achieved over a wide range of these parameters, and the selection of suitable conditions is within the skill of the art in view of the present disclosure. The hydroscopic acid/polyaniline solutions of the present invention can even be precipitated by merely allowing the absorption of water by the solutions. Crystalline polymer can also be precipitated by the rapid contact of the solution with water, such as with spun fibers.

The solid, crystalline polyanilines of the present invention differ from prior art polyaniline compositions in structure and conductivity. Prior polyaniline solids were found to be amorphous. In contrast, the polyaniline solids of the present invention are crystalline, not amorphous, as can be readily shown through X-ray diffraction. In general, the polyaniline of the present invention are from about 10% to about 90% crystalline, preferably at least about 25% crystalline, more preferably at least about 40% crystalline, and most preferably at least about 50% crystalline.

Furthermore, the solid polyaniline compositions of the present invention exhibit substantially greater conductivity than prior art solid polyanilines. While prior reports for conductivity of polyaniline reported values of no more than about 5 S/cm, the partial crystalline polyanilines of the present invention exhibit conductivities greater than 5 S/cm, preferably greater than 10 S/cm, and more preferably in the range of from about 20 to about 60 S/cm, or more. Another unique property of some polyanilines of the invention is the ability to be completely redissolved, including high molecular weight solid polyaniline, in an acid solution.

Typically, the polyaniline will be produced in an oxidized and protonated form, such as the emeraldine salt. It is well known how to convert this salt to other states, such as by compensation to the emeraldine base or by reduction to the leucoemeraldine form. For example, the emeraldine salt can be treated with a compensating agent, such as aqueous ammonia. Other suitable compensating agents include dilute aqueous or ethanolic solutions of potassium hydroxide, etc. To reduce to leucoemeraldine, suitable reducing agents include phenylhydrazine or aqueous solutions of hydrazine.

The invention is also directed to composites or polyblends of crystalline polyanilines with other polymers. Examples of such other polymers include, but are not limited to, polyamides, aromatic polyamides (aramids), and the like. Specific examples include polypara(phenylene terephthalamide) (Kevlar ®, DuPont), nylon 6, nylon 4.6, nylon 6.6; polyparabenzimide, and sulfonated polystyrene. See, e.g., "Polymer Handbook" (Brandrup & Immergut eds., 2nd ed. 1975). The primary consideration in selecting polymers for inclusion in the polymer blends of the present invention is that they be soluble in the acid solution containing the polyaniline. Typically, polyblends of the invention will contain a polyaniline in an amount ranging from about 5% to about 95% (w/w) relative to the total amount of polymer. The balance will be comprised of one or more co-soluble polymers. The inclusion of additional polymers in the solid polyaniline articles of the present invention can improve the performance characteristics of the solid articles; e.g., improved tear strength.

The polyaniline or polyaniline blend solutions described above can be fabricated into solid articles. Fabrication is accomplished by precipitating the dissolved polymers as described above. A film, for example, can be prepared by casting a polyaniline/acid solution onto a glass support, and then contacting the cast solution with water to precipitate the polyaniline (and other polymers if present) into a film. Fibers can be spun using standard spinning equipment. Other shapes, such as rods, can be prepared by standard extrusion techniques. The extruded material (as well as the spun material) is usually contacted immediately with a liquid bath, such as water, to fully precipitate the dissolved polymer(s).

The solid polyaniline compositions of the present invention have many applications. For example, the crystalline polyanilines of the present invention can be employed, for example, in electrodes (see, e.g., U.S. Pat. No. 4,461,691); semiconductor devices (see, e.g., U.S. Pat. No. 4,025,342); batteries or photovoltaic cells (see, e.g., U.S. Pat. No. 4,520,086); and electronic color display devices (see, e.g., U.S. Pat. No. 4,749,260). The disclosures of the foregoing patents are incorporated herein by reference.

The following examples are provided for illustrative purposes only, and are not intended to limit the scope of the present invention, which is defined in the appended claims.

EXAMPLE 1

Polyaniline was prepared according to the following method. MacDiarmid et al. (1985) Mol. Cryst. Liq. Cryst. 121:173. A solution of 13.3 ml of freshly distilled aniline (Mallinckrodt) and 150 ml of 1.33 M HCl (Fisher) was prepared in an 250 ml Erlenmeyer flask. The flask was placed in a cooling bath maintained at $-5°$ C. Polymerization was effected by addition of an oxidant solution. This oxidant solution was prepared separately as follows. In a beaker 15.33 g of (NH (Aldrich) were dissolved in 26.7 ml of distilled water. The resulting solution (35 ml) was transferred to a 60 cc syringe and was dripped at a rate of 0.58 ml/min into the Erlemeyer flask containing the constantly stirred aniline solution. After all oxidant was added (1 hr), the flask was capped and left stirring overnight. The molar ratio aniline: $(NH_4)_2S_2O_8$ was 2:1; the final concentration of HCl in the reaction mixture was approximately 1 M.

The (precipitated) polymer powder was recovered, filtered and washed with distilled water until the pH of washing liquid was 6-7. Subsequently, the polymer was washed with methanol until the liquid was clear, and then with ethyl ether to eliminate residual water and methanol. Finally, the polymer was dried overnight in a vacuum oven at 60° C. The polyaniline yield was 4.86 g (36.1%).

EXAMPLES 2-4

Example 1 was repeated, but the polymerization temperature was, respectively, 0°, 10° and 30° C.

EXAMPLES 5-7

Examples 1 was repeated, but the oxidant was added over a period of, respectively, 180, 30 and 0.1 min.

EXAMPLES 8-11

Example 1 was repeated, but the molar ratio aniline: $(NH_4)_2S_2O_8$ was, respectively, 8:1, 4:, 1.5:1, and 1:1.

EXAMPLE 12

In agreement with previous findings (Wang et al. (1986) Synth. Met. 16:99; Watanabe et al. (1987) Chem. Commun. 3), all "as synthesized" polyanilines (emeraldine salt) were found to be essentially insoluble in DMF and THF. In contrast, all materials synthesized according to Examples 1-11 readily and completely dissolved at room temperature in standard, concentrated (97%) sulfuric acid, to polymer concentrations as high as 20% w/w, yielding homogeneous viscous solutions of a purple-black color. At elevated temperatures even higher polyaniline concentrations were obtained.

EXAMPLE 13

Dissolution of polyaniline in sulfuric acid and precipitation in water or methanol took place without appreciable degradation or crosslinking. This conclusion was derived from the following experimental results. Polyaniline of example 1 (emeraldine base) was extracted with tetrahydrofuran (THF) to remove (20% w/w) oligomeric material. The solid residue was then completely dissolved in sulfuric acid and subsequently precipitated in water. Since the precipitated material (after compensation to the emeraldine base form) exhibited no significant solubility in THF, we conclude that dissolution in sulfuric acid did not lead to a significant reduction in chain length. Moreover, it was observed that the viscosity of polyaniline/sulfuric acid solutions did not significantly decrease upon storage at room temperature for 4 days. The polyaniline was found to be repeatedly and completely soluble in sulfuric acid; thus, dissolution and precipitation occurred without significant crosslinking. This finding is in stark contrast to results generally obtained with polyaniline films cast from N-methylpyrrolidone (NMP). These films were in most cases neither re-soluble in NMP nor in sulfuric acid, which is indicative of network formation. Andreatta et al. (to be published).

EXAMPLES 14-30

The inherent viscosities (in dl/g) of the polyanilines of Examples 1-16 (base form, made by exposure to aqueous $NH_3$ and subsequent washing with water followed by methanol) were determined at 25° C. in $H_2SO_4$ (0.1% w/w polymer), using an Ubbelohde viscometer. The results are presented in Table 1.

TABLE 1

| Time to add oxidant (min) | Polymerization Temperature (°C.) | | | |
|---|---|---|---|---|
| | −5 | 0 | 10 | 30 |
| 0.1 | 1.08 | 0.69 | 0.72 | 0.56 |
| 30 | 1.55 | 0.85 | 0.93 | 0.71 |
| 60 | 1.22 | 1.01 | 0.98 | 0.73 |
| 180 | 1.24 | 1.10 | 0.90 | 0.75 |

The conformation of polyaniline in the liquid state is not established, and, as a result, viscosity data are difficult to interpret. Therefore, we carried out viscosity measurements of samples of the rigid chain polypara-(phenylene terephthalamide) (Kevlar®, DuPont) and of the flexible nylon-6 under identical conditions. From the comparison with results obtained with these polymers, and Mark-Houwink relations reported for these systems (Baird et al. (1978) J. Poly. Sci., Poly. Chem. Ed. 16:61; Kamide et al. (1978) Kobunshi Ronbunsha 35:467), we estimate that the molecular weight of the dissolved polyaniline of Example 1 is between 12,000 (rigid chain limit) and 40,000 (flexible chain limit). Extraction of the THF-soluble fraction (about 20% w/w) from the base form of polyaniline leads to a significant increase in the viscosity.

EXAMPLE 31

The material of Example 1 was used to investigate the solubility of polyaniline in solvents other than sulfuric acid. The results are summarized in the following Table 2.

TABLE 2

| Acid | Solubility |
|---|---|
| $CH_3SO_3H$ | X |
| $CF_3SO_3H$ | X |
| $CF_3COOH$ | d |
| formic (88%) | d |
| polyphosphoric | d |
| $CH_3COOH$ (100%) | O |
| HCl (36%) | O |
| HF (49%) | O |
| $ClSO_3H$ | * |
| $H_2SO_4$ (fuming) | * |
| $HNO_3$ (70%) | ** |
| $HNO_3$ (fuming) | ** |

X - completely dissolved
d - slightly dissolved
O - insoluble
*dissolved with slight degradation (as indicated by infrared spectrum)
**dissolved with major degradation (as indicated by infrared spectrum)

EXAMPLE 32

Figure 2:
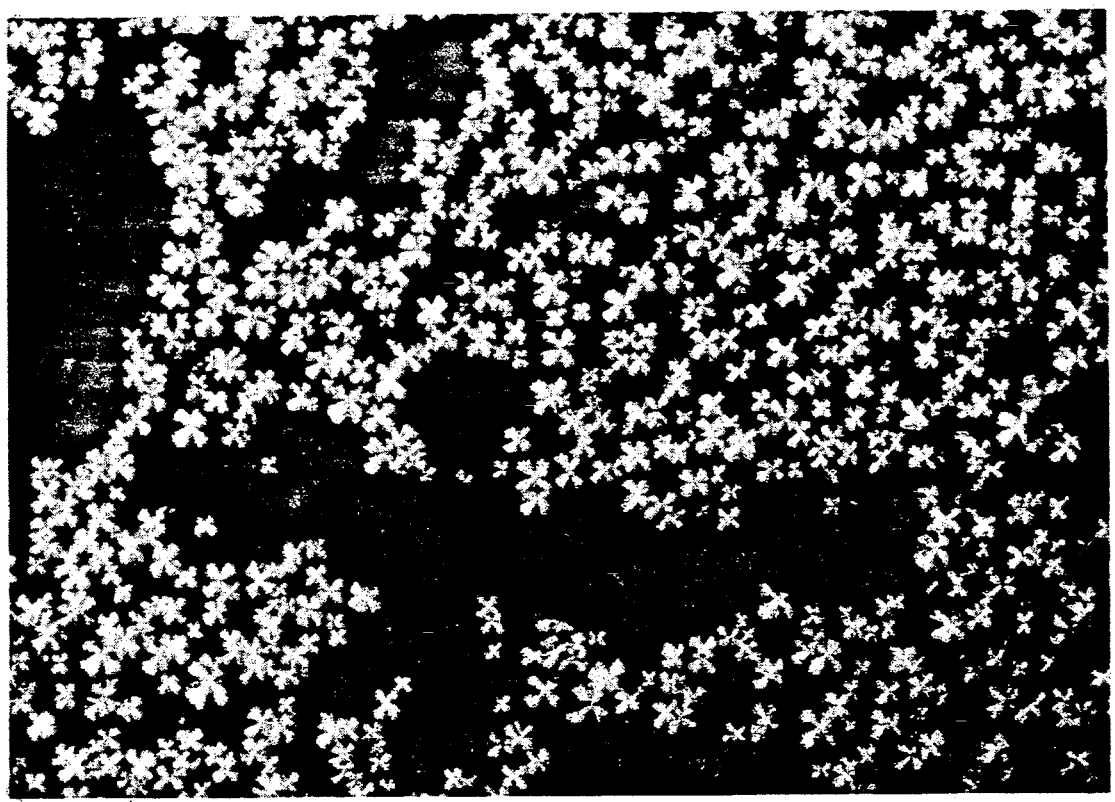
FIG. 2 shows the optical micrograph (crossed polarizers) of polyaniline spherulitic structures grown from a 15% solution in H by exposure to air.

The polyaniline (emeraldine salt) of Example 1 was dissolved in concentrated sulfuric acid. The polymer concentration was 15% w/w. The viscous solution was cast into a film, and the polyaniline was precipitated in water, to form a coherent film. The recovered polyaniline film was of the crystalline form. This is evidenced by the wide-angle X-ray diffraction pattern shown in FIG. 2. The formation of highly crystalline polymer has not been previously observed either in as-synthesized material or in polyaniline cast from NMP, which is largely amorphous. Annis et al. (1988) Synth. Met. 22:191; Andreatta et al. (to be published). Slow precipitation of the polymer, by exposing polyaniline/sulfuric acid solutions to moist air, resulted in the growth of birefringent, well-defined spherulitic structures (FIG. 2) and increased perfection of the corresponding wide-angle X-ray diffraction pattern. After precipitation, the material can be compensated to the crystalline emeraldine base form by exposure to aqueous $NH_3$ solutions (and subsequent washing). Similar results were obtained with a wide variety of liquids other than water, such as e.g. methanol.

EXAMPLE 33

Continuous polyaniline monofilaments were prepared from a 20% w/w solution of the polymer of Example 1 in 96% $H_2SO_4$ using a laboratory-scale spinning device. The solutions were extruded at 60° C., and dry-jet wet spun into chilled water. The as-spun fibers were washed with distilled water and dried overnight at 60° C. in a vacuum oven, while kept at constant length. The dried fibers were exceptionally smooth and had a shiny, metal-like appearance. The diameter was 290 mm.

Figure 3:
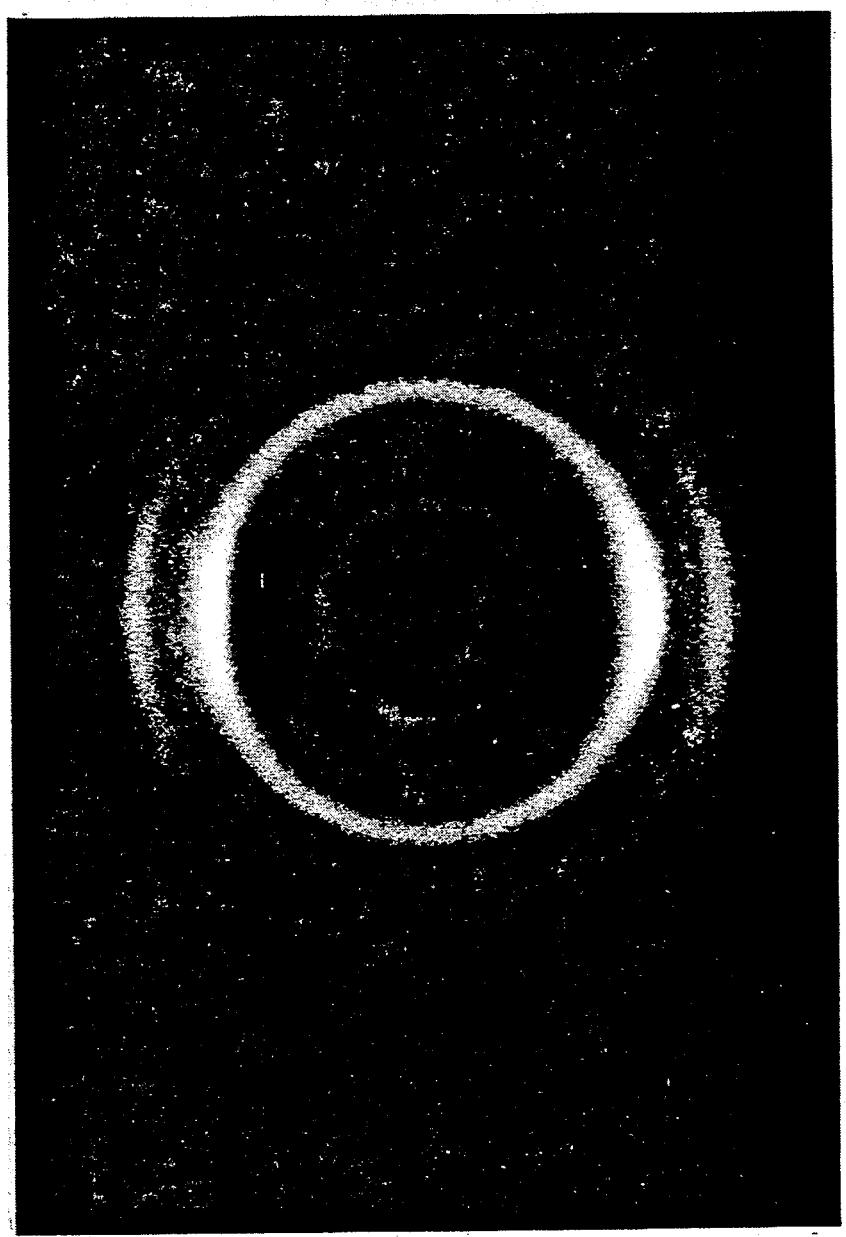
FIG. 3 WAXS-pattern of polyaniline showing fiber orientation; the fiber axis is vertical.

A wide-angle X-ray diffraction pattern of a polyaniline filament is shown in FIG. 3. The pattern reveals orientation in the as-spun fibers produced in these experiments.

EXAMPLE 34

The electrical conductivity of the as-spun, dried polyaniline (emeraldine salt) fibers of Example 33 was determined to be in the range from 20-60 S/cm, using the standard four-probe method. This value significantly exceeds the conductivity that is commonly reported for polyaniline (approx. 5 S/cm). MacDiarmid et al. (1986) Synth. Met. 18:285; Wudl et al. (1987) J. Am. Chem. Soc. 109:3677.

EXAMPLE 35

A solution was prepared at room temperature in concentrated sulfuric acid of the polyaniline of Example 1 and the rigid chain molecule poly-para (phenylene terephthalamide) [Kevlar, Du Pont molecular weight approximately 40,000]. The ratio of the two polymers by weight was 1:1. The overall polymer concentration was 5% w/w. At elevated temperatures, substantially higher polymer concentrations could be obtained. The solution was extruded at room temperature, and dry-jet wet spun into chilled water. The as-spun monofilaments were washed with distilled water and dried overnight at 60° C. in a vacuum oven, while kept at constant length. The dried fibers were exceptionally smooth and had a shiny, metal-like appearance. The electrical conductivity of the as-spun, dried polyaniline composite fibers was determined to be 1 S/cm, using the standard four-probe method.

Variations on the above embodiments will be readily apparent to those skilled in the art. Thus, the invention is not to be limited thereby and is to be defined according to the following claims.

We claim:

1. A solid composition comprising an acid soluble, electrically conductive polyaniline having a minimum molecular weight of at least about 5,000 that is from about 10% to 90% crystalline, said polyaniline comprised of monomer units in any of their oxidation states which allow for the composition to be electrically conductive, the monomer units having the structure:

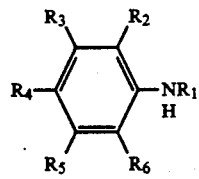

wherein $R_1$ is H or alkyl, and $R_2$-$R_6$ are, independently, H, alkyl, aralalkyl, alkaryl, hydroxy, alkyloxy, halogen or nitro.

2. The solid composition of claim 1 wherein $R_1$-$R_6$ are H, and the oxidation state of the monomer units of the polyaniline result in the polyaniline taking a form selected from the group consisting of the emeraldine salt form, the emeraldine base form, and leucoemeraldine form.

3. The solid composition of claim 1 wherein said polyaniline has a minimum molecular weight of about 10,000.

4. The solid composition of claim 1 wherein the monomer units consist essentially of aniline and the composition consists essentially of polyaniline.

5. The solid composition of claim 1 wherein the composition has a minimum electrical conductivity of about 10 S/cm.

6. A shaped article produced from the composition of claim 1.

7. The shaped article of claim 6 which is in the form of a film.

8. The shaped article of claim 6 which is in the form of a fiber.

9. The shaped article of claim 6 which is in the form of a tape.

10. The shaped article of claim 5 which is in the form of a rod.

11. A shaped article produced from the composition of claim 4.

12. The shaped article of claim 11 which is in the form of a fiber.

13. The shaped article of claim 11 which is in the form of a film.

14. The shaped article of claim 11 which is in the form of a tape.

15. The shaped article of claim 11 which is in the form of a rod.

* * * * *